(12) United States Patent
Kim et al.

(10) Patent No.: US 8,300,486 B2
(45) Date of Patent: Oct. 30, 2012

(54) TEMPERATURE DETECTION CIRCUIT OF SEMICONDUCTOR MEMORY APPARATUS

(75) Inventors: Je-Yoon Kim, Gyeonggi-do (KR); Jong-Chern Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 267 days.

(21) Appl. No.: 12/650,073

(22) Filed: Dec. 30, 2009

(65) Prior Publication Data

US 2010/0315896 A1  Dec. 16, 2010

(30) Foreign Application Priority Data

Jun. 16, 2009  (KR) .................. 10-2009-0053348

(51) Int. Cl.
*G11C 7/04* (2006.01)
(52) U.S. Cl. ........................................ 365/211
(58) Field of Classification Search ........... 365/211
See application file for complete search history.

(56) References Cited

U.S. PATENT DOCUMENTS

| | | | |
|---|---|---|---|
| 6,928,007 B2 | 8/2005 | Jin | |
| 6,980,020 B2 | 12/2005 | Best et al. | |
| 7,019,555 B2 | 3/2006 | Lee | |
| 7,034,565 B2 | 4/2006 | Lee | |
| 7,064,989 B2 | 6/2006 | Na et al. | |
| 8,049,145 B1 * | 11/2011 | Walker | 219/502 |
| 2004/0100837 A1 | 5/2004 | Lee | |
| 2005/0001596 A1 * | 1/2005 | Lovett | 320/150 |
| 2009/0043450 A1 | 2/2009 | Tonegawa et al. | |

FOREIGN PATENT DOCUMENTS

| | | |
|---|---|---|
| JP | 05-227669 | 9/1993 |
| JP | 2001-078304 | 3/2001 |
| JP | 2004-310981 | 11/2004 |
| JP | 2005-153684 | 6/2005 |
| JP | 2005-228458 | 8/2005 |
| JP | 2005-339187 | 12/2005 |
| JP | 2007-064091 | 3/2007 |
| JP | 2007-116799 | 5/2007 |
| JP | 2007-158630 | 6/2007 |
| JP | 2007-236172 | 9/2007 |
| JP | 2007-252016 | 9/2007 |
| KR | 102006001158 | 7/2004 |
| KR | 102007003664 | 6/2006 |
| KR | 100861371 | 6/2007 |

* cited by examiner

*Primary Examiner* — Hoai V Ho
*Assistant Examiner* — Anthan Tran
(74) *Attorney, Agent, or Firm* — Venable LLP; Jeffri A. Kaminski

(57) ABSTRACT

A temperature detection circuit of a semiconductor memory apparatus includes a fixed period oscillator, a temperature variable signal generating unit and a counting unit. The oscillator is configured to generate a fixed period oscillator signal when an enable signal is enabled. The temperature variable signal generating unit is configured to generate a temperature variable signal whose enable interval varies based on temperature variations, when the enable signal is enabled. The counting unit is configured to count the oscillator signal during the enable interval of the temperature variable signal to generate a temperature information signal.

12 Claims, 2 Drawing Sheets

TEMPERATURE DETECTION CIRCUIT OF SEMICONDUCTOR MEMORY APPARATUS

CROSS-REFERENCES TO RELATED APPLICATION

The present application claims priority under 35 U.S.C 119(a) to Korean Application No 10-2009-0053348, filed on Jun. 16, 2009, in the Korean Intellectual Property Office, which is incorporated herein by reference in its entirety as set forth in full.

BACKGROUND OF THE INVENTION

1. Technical Field

Embodiments relate to a semiconductor memory apparatus, and more particularly, to a temperature detection circuit of the semiconductor memory apparatus.

2. Related Art

In general, a semiconductor memory apparatus stores data by electrically charging or discharging an electric charge in a capacitor. Therefore, the semiconductor memory apparatus is designed such that the semiconductor memory apparatus can perform a refresh operation for substantially maintaining a voltage level of the capacitor. In other words, the semiconductor memory apparatus can retain the stored data by performing the refresh operation periodically and repetitively.

With a recent trend toward low power consumption of the semiconductor memory apparatus, various techniques to reduce the power consumed during the refresh operation have been provided. As one of the techniques to reduce the power consumed during the refresh operation, there is a technique that performs the refresh operation by varying a repetition period of the refresh operation based on temperature variations.

Accordingly, in order to vary the repetition period of the refresh operation based on the temperature variations, a temperature detection circuit is required inside the semiconductor memory apparatus.

SUMMARY OF THE INVENTION

The embodiments of the present invention include a temperature detection circuit of a semiconductor memory apparatus capable of detecting temperature variations inside the semiconductor memory apparatus.

In one embodiment of the present invention, a temperature detection circuit of a semiconductor memory apparatus includes: a fixed period oscillator configured to generate an oscillator signal when an enable signal is enabled; a temperature variable signal generating unit configured to generate a temperature variable signal whose enable interval varies based on temperature variations, when the enable signal is enabled; and a counting unit configured to count the oscillator signal during the enable interval of the temperature variable signal to generate a temperature information signal.

In another embodiment of the present invention, a temperature detection circuit of a semiconductor memory apparatus includes: a temperature variable signal generating unit configured to enable a temperature variable signal when an enable signal is enabled, and to charge a capacitor, and to discharge the capacitor when a voltage level of the capacitor is increased to above a reference voltage level, and to disable the temperature variable signal when the voltage level of the capacitor is decreased to below the reference voltage level; and a counting unit configured to count an oscillator signal during an enable interval of the temperature variable signal to generate a temperature information signal.

BRIEF DESCRIPTION OF THE DRAWINGS

Features, aspects, and embodiments are described in conjunction with the attached drawings, in which.

DETAILED DESCRIPTION OF THE PREFERRED EMBODIMENTS

Hereinafter, a temperature detection circuit of semiconductor memory apparatus, according to an exemplary embodiment of the present invention, will be described with reference to the accompanying drawings through preferred embodiments.

Figure 1:
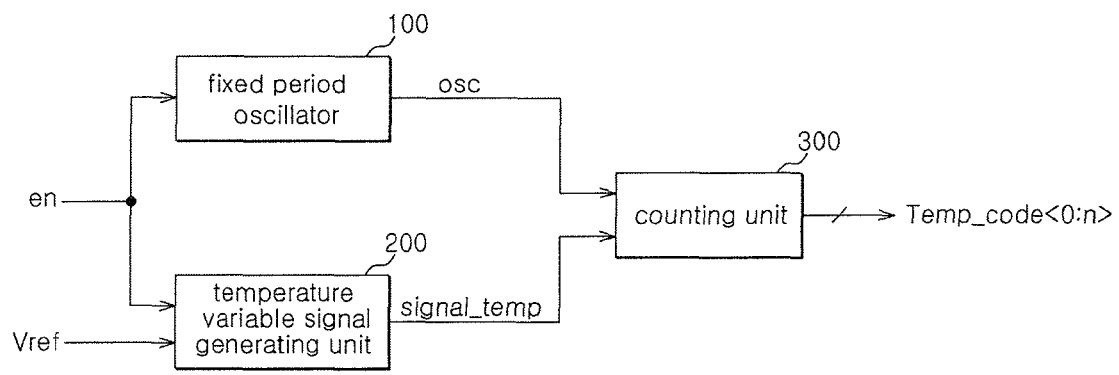
FIG. 1 is a block diagram schematically showing a configuration of a temperature detection circuit of a semiconductor memory apparatus according to an embodiment.

FIG. 1 is a block diagram schematically showing a configuration of a temperature detection circuit of a semiconductor memory apparatus according to an embodiment. As shown in FIG. 1, the temperature detection circuit of the semiconductor memory apparatus according to the disclosed embodiment includes a fixed period oscillator 100, a temperature variable signal generating unit 200 and a counting unit 300.

The fixed period oscillator 100 generates an oscillator signal 'osc' when an enable signal 'en' is enabled. The enable signal 'en' can be an on-die termination enable signal. In general, the semiconductor memory apparatus is configured such that, when the semiconductor memory apparatus outputs data through pads, noise of the output data can be minimized by matching impedance values of the outside and the inside of the semiconductor memory apparatus. As such, a circuit that performs the operation for matching the external impedance and the internal impedance of the semiconductor memory apparatus is called an on-die termination circuit. By using the on-die termination enable signal as the enable signal 'en' of the embodiment, the temperature detection circuit of the embodiment can detect temperature variations during the time the semiconductor memory apparatus performs the impedance matching operation.

Figure 2:
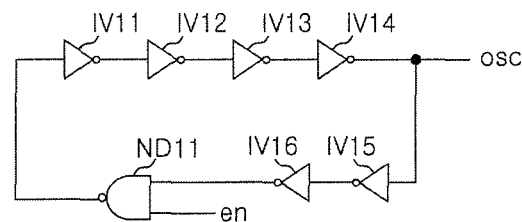
FIG. 2 is a diagram showing a configuration of an embodiment of a fixed period oscillator of FIG. 1.

FIG. 2 is a diagram showing a configuration of an exemplary embodiment of the fixed period oscillator 100 of FIG. 1.

As shown in FIG. 2, the fixed period oscillator 100 includes first to sixth inverters IV11 to IV16 and a first NAND gate ND11. The first to sixth inverters IV11 to IV16 are coupled in series. The first NAND gate ND11 receives both an output signal of the sixth inverter IV16 and the enable signal 'en', and outputs its output signal to the first inverter IV11.

Referring to FIG. 1, when the enable signal 'en' is enabled, the temperature variable signal generating unit 200 generates a temperature variable signal 'signal_temp' whose enable interval varies based on the temperature variations. That is, the temperature variable signal generating unit 200 enables the temperature variable signal 'signal_temp' when the enable signal 'en' is enabled, and then varies a disable timing of the temperature variable signal 'signal_temp' based on the temperature variations.

Figure 3:
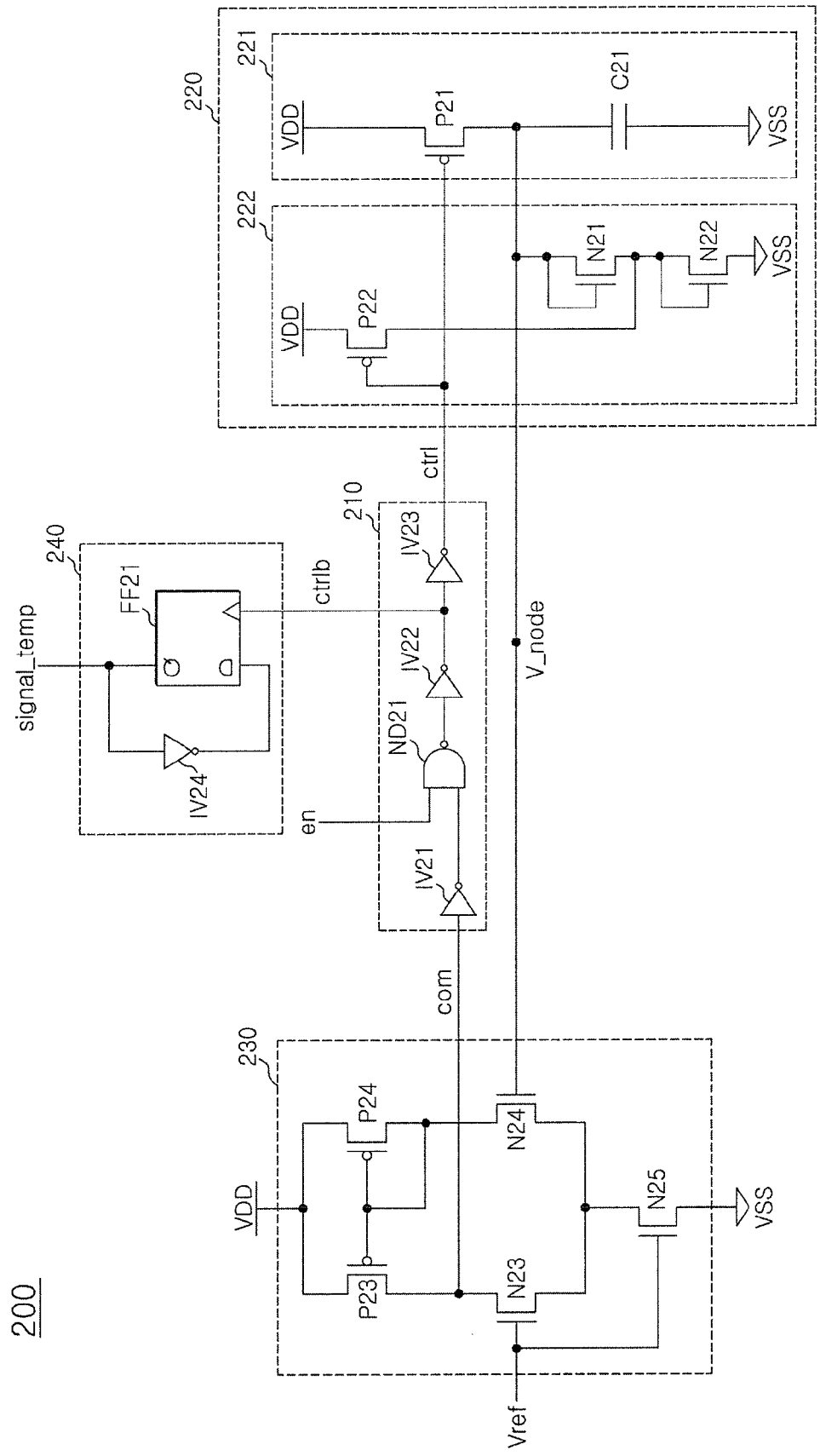
FIG. 3 is a diagram showing a configuration of an embodiment of a temperature variable signal generating unit of FIG. 1.

FIG. 3 is a diagram showing a configuration of an exemplary embodiment of the temperature variable signal generating unit 200 of FIG. 1.

Referring to FIG. 3, the temperature variable signal generating unit 200 increases a voltage level of the voltage node 'V_node' when the enable signal 'en' is enabled at a logic high level. Afterwards, the temperature variable signal generating unit 200 decreases the voltage level of the voltage node 'V_node' when the voltage level of the voltage node 'V_node' is increased to above a reference voltage (Vref) level, and then disables the enabled temperature variable signal 'signal_temp' when the voltage level of the voltage node 'V_node' is decreased to below the reference voltage (Vref) level. At this time, when the voltage level of the voltage node 'V_node' is increased to above the reference voltage (Vref) level and subsequently the voltage level of the voltage node 'V_node' is decreased, the temperature variable signal generating unit 200 increases a voltage drop width of the voltage node 'V_node' as the temperature goes up, and decreases the voltage drop width of the voltage node 'V_node' as the temperature goes down.

As shown in FIG. 3, the temperature variable signal generating unit 200 includes a control unit 210, a voltage node level control unit 220, a comparison unit 230 and a frequency dividing unit 240.

In response to the enable signal 'en' and a comparison signal 'com', the control unit 210 generates a control signal 'ctrl' and an inverted control signal 'ctrlb', i.e., an inverted signal of the control signal 'ctrl'. For example, when the enable signal 'en' is disabled at a logic low level, the control unit 210 disables the control signal 'ctrl' to a logic high level regardless of the comparison signal 'com'. On the other hand, when the enable signal 'en' is enabled at a logic high level, the control unit 210 generates the control signal 'ctrl' in response to the comparison signal 'com'. In detail, the control unit 210 disables the control signal 'ctrl' to a logic high level if the enable signal 'en' is enabled at a logic high level and the comparison signal 'com' is enabled at a logic high level, and enables the control signal 'ctrl' to a logic low level if the enable signal 'en' is enabled at a logic high level and the comparison signal 'com' is disabled at a logic low level.

The control unit 210 includes seventh to ninth inverters IV21 to IV23 and a second NAND gate ND21. The seventh inverter IV21 receives the comparison signal 'com'. The second NAND gate ND21 receives both an output signal of the seventh inverter IV21 and the enable signal 'en'. The eighth inverter IV22 receives an output signal of the second NAND gate ND21 to output the inverted control signal 'ctrlb'. The ninth inverter IV23 receives an output signal of the eighth inverter IV22 to output the control signal 'ctrl'.

The voltage node level control unit 220 increases the voltage level of the voltage node 'V_node' when the control signal 'ctrl' is enabled at a logic low level, and decreases the voltage level of the voltage node 'V_node' when the control signal 'ctrl' is disabled at a logic high level.

As shown in FIG. 3, the voltage node level control unit 220 includes a charging unit 221 and a discharging unit 222.

When the control signal 'ctrl' is enabled at a logic low level, the charging unit 221 charges a capacitor C21 to increase the voltage level of the voltage node 'V_node'.

The charging unit 221 includes a first transistor P21 and the capacitor C21. The first transistor P21 has a gate configured to receive the control signal 'ctrl' and a source configured to receive an external voltage VDD. One terminal of the capacitor C21 is coupled to a drain of the first transistor P21, and the other terminal thereof is coupled to a ground terminal VSS.

When the control signal 'ctrl' is disabled at a logic high level, the discharging unit 222 discharges the capacitor C21 to decrease the voltage level of the voltage node 'V_node'. On the other hand, when the control signal 'ctrl' is enabled at a logic low level, the discharging unit 222 substantially prevents the voltage level of the voltage node 'V_node' from being decreased.

The discharging unit 222 includes second to fourth transistors N21, N22 and P22. The second transistor N21 has a gate and a drain commonly coupled to the voltage node 'V_node'. The third transistor N22 has a gate and a drain commonly coupled to a source of the second transistor N21, and a source coupled to the ground terminal VSS. The fourth transistor P22 has a gate configured to receive the control signal 'ctrl', a source configured to receive the external voltage VDD, and a drain coupled to a node to which the second and third transistors N21 and N22 are commonly coupled.

Herein, as the temperature goes up, a threshold voltage level decreases, and consequently the second and third transistors N21 and N22 increase an amount of current flowing from the voltage node 'V_node' to the ground terminal VSS. Accordingly, as the temperature goes up, the voltage drop width of the voltage node 'V_node' increases. On the other hand, as the temperature goes down, the threshold voltage level increases, and consequently the second and third transistors N21 and N22 decrease the amount of current flowing from the voltage node 'V_node' to the ground terminal VSS. Accordingly, as the temperature goes down, the voltage drop width of the voltage node 'V_node' decreases.

As the temperature goes up, the discharging unit 222 more quickly decreases the voltage level of the voltage node 'V_node', which is higher than the reference voltage (Vref) level, to below the reference voltage (Vref) level, and as the temperature goes down, the discharging unit 222 more slowly decreases the voltage level of the voltage node 'V_node', which is higher than the reference voltage (Vref) level, to below the reference voltage (Vref) level. In addition, when the control signal 'ctrl' is enabled at a logic low level, the fourth transistor P22 increases a voltage level of the source of the second transistor N21 to turn off the second transistor N21. Therefore, the discharging unit 222 does not decrease the voltage level of the voltage node 'V_node' when the control signal 'ctrl' is enabled at a logic low level, and decreases the voltage level of the voltage node 'V_node' only when the control signal 'ctrl' is disabled at a logic high level. Consequently, since the fourth transistor P22 determines whether the discharging unit 222 operates or not, the fourth transistor P22 can be called a discharge control unit.

The comparison unit 230 compares the voltage level of the voltage node 'V_node' with the reference voltage (Vref) level to generate the comparison signal 'com'. In detail, the comparison unit 230 outputs the comparison signal 'com' disabled at a logic low level if the voltage level of the voltage node 'V_node' is lower than the reference voltage (Vref) level, and outputs the comparison signal 'com' enabled at a logic high level if the voltage level of the voltage node 'V_node' is higher than the reference voltage (Vref) level.

The comparison unit 230 includes fifth to ninth transistors N23 to N25, P23 and P24. The fifth transistor N23 receives the reference voltage Vref through its gate. The sixth transistor N24 has a gate coupled to the voltage node 'V_node'. The seventh transistor N25 has a gate configured to receive the reference voltage Vref, a drain coupled to a node to which sources of the fifth and sixth transistors N23 and N24 are commonly coupled, and a source coupled to the ground terminal VSS. The eighth transistor P23 has a source configured to receive the external voltage VDD and a drain coupled to a drain of the fifth transistor N23. The ninth transistor P24 has a source configured to receive the external voltage VDD, and a gate and a drain commonly coupled to a node to which a gate of the eighth transistor P23 and a drain of the sixth transistor N24 are commonly coupled.

Next, the frequency dividing unit 240 generates the temperature variable signal 'signal_temp' in response to the inverted control signal 'ctrlb'. In detail, the frequency dividing unit 240 inverts a voltage level of the temperature variable signal 'signal_temp' every time the inverted control signal 'ctrlb' transitions to a logic high level. Here, the temperature variable signal 'signal_temp' output from the frequency dividing unit 240 has a logic low level as its initialization value.

The frequency dividing unit 240 includes a tenth inverter IV24 and a flip-flop FF21. The flip-flop FF21 receives the inverted control signal 'ctrlb' through its clock input terminal. The tenth inverter IV24 receives an output signal of the flip-flop FF21 to output its output signal as an input signal of the flip-flop FF21. Here, the output signal of the flip-flop FF21 is output as the temperature variable signal 'signal_temp'.

Referring to FIG. 1, the counting unit 300 counts the oscillator signal 'osc' during the interval where the temperature variable signal 'signal_temp' is enabled, and subsequently generates temperature information signals 'Temp_code<0:n>'. The counting unit 300 can be implemented using a conventional counting circuit.

In such a configuration, an operation of the temperature detection circuit of the semiconductor memory apparatus according to the disclosed embodiment will be described below.

Firstly, a state that the enable signal 'en' is disabled at a logic low level will be described. At this time, the output signal of the frequency dividing unit 240, i.e., the temperature variable signal 'signal_temp', is at a disable state of a logic low level.

In this state, referring to FIG. 3, since the enable signal 'en' is at a logic low level, the control unit 210 disables the control signal 'ctrl' to a logic high level. Accordingly, since the inverted control signal 'ctrlb' is the inverted signal of the control signal 'ctrl', the inverted control signal 'ctrlb' is at a logic low level.

In addition, since the control signal 'ctrl' is at a logic high level, the discharging unit 222 decreases the voltage level of the voltage node 'V_node'. At this time, since the voltage level of the voltage node 'V_node' is lower than the reference voltage (Vref) level, the comparison unit 230 outputs the comparison signal 'com' disabled at a logic low level.

Next, it will be assumed that the enable signal 'en' is enabled to a logic high level. In this state, since the comparison signal 'com' is at a logic low level and the enable signal 'en' is at a logic high level, the control unit 210 enables the control signal 'ctrl' to a logic low level. Therefore, the inverted control signal 'ctrlb' transitions to a logic high level, and thus the frequency dividing unit 240 transitions the temperature variable signal 'signal_temp' to a logic high level.

In addition, since the control signal 'ctrl' is enabled at a logic low level, the discharging unit 222 stops decreasing the voltage level of the voltage node 'V_node'. And, since the control signal 'ctrl' is enabled at a logic low level, the charging unit 221 charges the capacitor C21 to increase the voltage level of the voltage node 'V_node'. At this time, when the voltage level of the voltage node 'V_node' is increased to above the reference voltage (Vref) level, the comparison unit 230 outputs the comparison signal 'com' enabled at a logic high level. In this state, since the enable signal 'en' is at a logic high level and the comparison signal 'com' is at a logic high level, the control unit 210 disables the control signal 'ctrl' to a logic high level again. In this occasion, the inverted control signal 'ctrlb' also transitions to a logic low level.

In addition, since the control signal 'ctrl' is disabled at a logic high level, the charging unit 221 stops the charging operation on the capacitor C21. And, since the control signal 'ctrl' is disabled to a logic high level, the discharging unit 222 discharges the capacitor C21 to decrease the voltage level of the voltage node 'V_node'. At this time, when the voltage level of the voltage node 'V_node' is decreased to below the reference voltage (Vref) level, the comparison unit 230 disables the comparison signal 'com' to a logic low level. Accordingly, since the enable signal 'en' is at a logic high level and the comparison signal 'com' is at a logic low level, the control unit 210 enables the control signal 'ctrl' to a logic low level again. In this occasion, the inverted control signal 'ctrlb' also transitions to a logic high level again. Therefore, the frequency dividing unit 240 disables the temperature variable signal 'signal_temp' enabled at a logic high level to a logic low level.

In this way, the temperature variable signal 'signal_temp' is enabled to a logic high level and then is disabled to a logic low level. That is, during the process that the temperature variable signal 'signal_temp' is enabled and disabled, the temperature detection circuit according to the embodiment charges and discharges the capacitor C21, and enables and disables the temperature variable signal 'signal_temp' based on the comparison result of the voltage level of the voltage node 'V_node' and the reference voltage (Vref) level, thereby performing the operation repetitively.

That is, if the enable signal 'en' is enabled, the temperature variable signal generating unit 200 according to the embodiment enables the temperature variable signal 'signal_temp', and charges the capacitor C21 to increase the voltage level of the voltage node 'V_node'. Afterwards, when the voltage level of the voltage node 'V_node' is increased to above the reference voltage (Vref) level, the temperature variable signal generating unit 200 discharges the capacitor C21. As the capacitor C21 is discharged, when the voltage level of the voltage node 'V_node' is decreased to below the reference voltage (Vref) level, the temperature variable signal generating unit 200 disables the temperature variable signal 'signal_temp'. At this time, the second and third transistors N21 and N22 that decrease the voltage level of the voltage node 'V_node', i.e., discharge the capacitor C21, are coupled to each other in a diode configuration, and control the voltage drop width of the voltage node 'V_node' based on the temperature variations. In detail, since the threshold voltage level decreases as the temperature goes up, the second and third transistors N21 and N22 increase the voltage drop width of the voltage node 'V_node' as the temperature goes up, and decrease the voltage drop width of the voltage node 'V_node' as the temperature goes down.

As a result, the temperature variable signal generating unit 200 enables the temperature variable signal 'signal_temp', and makes a disable timing of the temperature variable signal 'signal_temp' earlier as the temperature goes up, and makes the disable timing of the temperature variable signal 'signal_temp' later as the temperature goes down.

Therefore, the counting unit 300, which counts the oscillator signal 'osc' only during the enable interval of the temperature variable signal 'signal_temp', outputs a code signal, i.e., the temperature information signals 'Temp_code<0:n>', that has a low counting value as the temperature goes up, and has a high counting value as the temperature goes down.

The temperature detection circuit of the semiconductor memory apparatus according to the exemplary embodiment can increase and decrease the enable interval of the temperature variable signal based on the temperature variations, and count the oscillator signal during the enable interval, and consequently output a multi-bit code signal containing information on the temperature variations.

While certain embodiments have been described above, it will be understood to those skilled in the art that the embodiments described are by way of example only. Accordingly, the device and method described herein should not be limited based on the described embodiments. Rather, the apparatus described herein should only be limited in light of the claims that follow when taken in conjunction with the above description and accompanying drawings.

What is claimed is:

1. A temperature detection circuit of a semiconductor memory apparatus comprising: a fixed period oscillator configured to generate an oscillator signal when an enable signal having a fixed period is enabled;
a temperature variable signal generating unit configured to generate a temperature variable signal whose enable interval varies based on temperature variations, when the enable signal is enabled; and
a counting unit configured to count the oscillator signal during the enable interval of the temperature variable signal to generate a temperature information signal, wherein the counting unit counts the oscillator signal during the interval where the temperature variable signal is enabled.

2. The temperature detection circuit of claim 1, wherein the enable signal includes an on-die termination enable signal.

3. The temperature detection circuit of claim 1, wherein the temperature information signal includes a multi-bit code.

4. The temperature detection circuit of claim 1, wherein the temperature variable signal generating unit is configured to enable the temperature variable signal when the enable signal is enabled, and to vary a disable timing of the temperature variable signal based on the temperature variations.

5. The temperature detection circuit of claim 4, wherein the temperature variable signal generating unit is configured to increase a voltage level of a voltage node when the enable signal is enabled, and to decrease the voltage level of the voltage node when the voltage level of the voltage node is increased to above a reference voltage level, and to disable the enabled temperature variable signal when the voltage level of the voltage node is decreased to below the reference voltage level.

6. The temperature detection circuit of claim 5, wherein when the voltage level of the voltage node is increased to above the reference voltage level and subsequently the voltage level of the voltage node is decreased, the temperature variable signal generating unit is configured to increase a voltage drop width of the voltage node as the temperature goes up, and to decrease the voltage drop width of the voltage node as the temperature goes down.

7. The temperature detection circuit of claim 6, wherein the temperature variable signal generating unit includes: a control unit configured to generate a control signal in response to the enable signal and a comparison signal; a voltage node level control unit configured to increase or decrease the voltage level of the voltage node in response to the control signal; a comparison unit configured to compare the voltage level of the voltage node with the reference voltage level to generate the comparison signal; and a frequency dividing unit configured to invert a voltage level of the temperature variable signal every time the control signal transitions to a specific level.

8. The temperature detection circuit of claim 7, wherein the control unit is configured to disable the control signal regardless of the comparison signal when the enable signal is disabled, and to generate the control signal in response to the comparison signal when the enable signal is enabled.

9. The temperature detection circuit of claim 8, wherein the control unit is configured to disable the control signal if the enable signal is enabled and the comparison signal is enabled, and to enable the control signal if the enable signal is enabled and the comparison signal is disabled.

10. The temperature detection circuit of claim 7, wherein the voltage node level control unit is configured to increase the voltage level of the voltage node when the control signal is enabled, and to decrease the voltage level of the voltage node when the control signal is disabled.

11. The temperature detection circuit of claim 10, wherein the voltage node level control unit includes: a charging unit configured to charge a capacitor to increase the voltage level of the voltage node when the control signal is enabled; and a discharging unit configured to discharge the capacitor to decrease the voltage level of the voltage node when the control signal is disabled.

12. The temperature detection circuit of claim 11, wherein the discharging unit includes: a first transistor configured to have a gate and a drain commonly coupled to the voltage node; a second transistor configured to have a gate and a drain commonly coupled to a source of the first transistor, and a source coupled to a ground terminal; and a third transistor configured to have a gate configured to receive the control signal, a source configured to receive an external voltage, and a drain coupled to a node to which the first and second transistors are commonly coupled, wherein the first and second transistors are configured to have threshold voltage levels which vary based on the temperature variations, so that the first and second transistors control an amount of current flowing from the voltage node to the ground terminal.

* * * * *